(12) United States Patent
    Murasawa et al.

(10) Patent No.: US 10,566,480 B2
(45) Date of Patent: Feb. 18, 2020

(54) SEALING MATERIAL FOR SOLAR CELL MODULES, AND MANUFACTURING METHOD THEREOF

(71) Applicant: Dai Nippon Printing Co., Ltd., Tokyo (JP)

(72) Inventors: Ken Murasawa, Tokyo (JP); Satoshi Osone, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 73 days.

(21) Appl. No.: 15/636,191

(22) Filed: Jun. 28, 2017

(65) Prior Publication Data

US 2017/0301813 A1    Oct. 19, 2017

Related U.S. Application Data

(62) Division of application No. 13/700,902, filed as application No. PCT/JP2011/062244 on May 27, 2011, now abandoned.

(30) Foreign Application Priority Data

May 31, 2010    (JP) ................................. 2010-124869

(51) Int. Cl.
    *C08F 10/02*    (2006.01)
    *C08F 8/06*     (2006.01)
    (Continued)

(52) U.S. Cl.
    CPC ........ *H01L 31/0481* (2013.01); *B32B 27/327* (2013.01); *C08J 3/24* (2013.01);
    (Continued)

(58) Field of Classification Search
    None
    See application file for complete search history.

(56) References Cited

U.S. PATENT DOCUMENTS 6,689,851 B1 * 2/2004 Rowland ................... C08F 8/00
                                                    526/223
2005/0051204 A1 * 3/2005 Oi ........................ H01L 31/048
                                                    136/251
(Continued)

FOREIGN PATENT DOCUMENTS

EP    2270077 A1    1/2011
JP    2000-091611 A    3/2000
(Continued)

OTHER PUBLICATIONS

International Search Report of PCT/JP2011/062244.
(Continued)

*Primary Examiner* — Richard A Huhn
(74) *Attorney, Agent, or Firm* — Locke Lord LLP; James E. Armstrong, IV; Nicholas J. DiCeglie, Jr.

(57) ABSTRACT

Disclosed are a sealing material for solar cell modules and a manufacturing method thereof capable of endowing good transparency and heat resistance to the sealing material for solar cell modules while using a polyethylene-based resin. The disclosed sealing material for solar cell modules uses a polyethylene-based resin with a density of 0.900 g/cm3 or less, and an MFR between 0.1 g/10 min and 1.0 g/10 min. The sealing material is obtained by melt molding a resin composition containing a polyethylene-based resin with density 0.890 g/cm3 or less, and a polymerization initiator contained at 0.02 mass % or more but less than 0.5 mass % of the composition, wherein the density difference of the resin composition before and after the melt molding is within 0.05 g/cm3, and the MFR difference of the resin composition before and after the melt molding is 1.0 g/10 min or greater.

21 Claims, 1 Drawing Sheet

(51) Int. Cl.
    *C08K 5/14*         (2006.01)
    *C08J 3/24*         (2006.01)
    *H01L 31/048*     (2014.01)
    *B32B 27/32*      (2006.01)
    *C09K 3/10*         (2006.01)
    *C08L 23/08*      (2006.01)
    *C09J 7/00*         (2018.01)
    *C08K 5/00*         (2006.01)
    *C09J 123/06*     (2006.01)
    *C09J 123/26*     (2006.01)

(52) U.S. Cl.
    CPC ............ *C08K 5/14* (2013.01); *C08L 23/0815* (2013.01); *C09J 7/00* (2013.01); *C09K 3/10* (2013.01); *H01L 31/048* (2013.01); *B32B 2457/12* (2013.01); *C08F 8/06* (2013.01); *C08F 2500/08* (2013.01); *C08F 2810/20* (2013.01); *C08J 2323/06* (2013.01); *C08J 2323/26* (2013.01); *C08K 5/0025* (2013.01); *C08L 2312/08* (2013.01); *C08L 2314/06* (2013.01); *C09J 123/06* (2013.01); *C09J 123/26* (2013.01); *C09J 2423/04* (2013.01); *C09K 2200/062* (2013.01); *Y02E 10/50* (2013.01); *Y10T 428/24992* (2015.01)

(56) References Cited

U.S. PATENT DOCUMENTS

2009/0120489 A1     5/2009     Nishijima et al.
2009/0198032 A1     8/2009     Torkelson et al.
2011/0045287 A1     2/2011     Kawashima et al.

FOREIGN PATENT DOCUMENTS

| | | |
|---|---|---|
| JP | 2003-046105 A | 2/2003 |
| JP | 2008-117925 A | 5/2008 |
| JP | 2009-010277 A | 1/2009 |
| JP | 2009253130 A | 10/2009 |
| JP | 2010007035 A | 1/2010 |
| JP | 2010-059277 A | 3/2010 |
| JP | 2010226040 A | 10/2010 |
| WO | WO-2009125685 A1 | 10/2009 |

OTHER PUBLICATIONS

Japanese Office Action in Japanese Patent Application No. 2012-518365.
Extended European Search Report issued to EP Application No. 11789717.3, dated Nov. 3, 2014.
Office Action dated Jan. 30, 2015 issued for corresponding Chinese Patent Application No. 201180026779.9.
English machine translations of JP 2008117925 A.
Fujiki et al., "Flow properties of molten ethylene-vinyl acetate copolymer and melt fracture," J. App. Polymer Science, vol. 12, pp. 267-279 (1968).
Boustead, "Linear Low Density POlyethylene (LLDPE)," published Mar. 2005.

* cited by examiner

SEALING MATERIAL FOR SOLAR CELL MODULES, AND MANUFACTURING METHOD THEREOF

This Application is a Division of U.S. patent application Ser. No. 13/700,902 filed on Mar. 27, 2013, which application is the National Phase under 35 U.S.C. § 371 of PCT International Application No. PCT/JP2011/062244, filed May 27, 2011, which claims the benefit of JP Patent Application No. 2010-124869 filed on May 31, 2010, the entire contents of each of the aforementioned applications are incorporated herein by reference in their entirety.

TECHNICAL FIELD

The invention relates to a sealing material for use in a solar cell module (a solar cell module-forming sealing material) and a method for manufacturing a solar cell module.

BACKGROUND ART

Recently, with increasing consciousness about environmental problems, solar batteries have attracted attention as clean energy sources. A solar cell module for forming a solar battery includes solar cell elements, which play a role to convert light energy, such as sunlight, to electric energy.

Solar cell elements are often made using a monocrystalline silicon substrate or a polycrystalline silicon substrate. Thus, solar cell elements are vulnerable to mechanical impact, and a solar cell module placed outdoors needs to be protected from rain, etc. Since electric power generated from a piece of solar cell element is small, a plurality of solar cell elements must be connected in series and parallel so that a practical level of electric power can be output. Thus, a solar cell module is commonly made by connecting a plurality of solar cell elements and sealing them with a transparent substrate and a sealing material. In general, a solar cell module is produced by sequentially stacking members including a transparent front substrate, a sealing material, solar cell elements, another sealing material, and a rear surface-protecting sheet, etc., and subjecting them to a lamination process or the like in which they are subjected to vacuum aspiration and thermocompression bonding.

In view of processability, workability, manufacturing cost, and other points, ethylene-vinyl acetate copolymer (EVA) resin is most commonly used as a sealing material for solar cell modules. Unfortunately, EVA resin tends to gradually decompose over long-term use and may deteriorate in a solar cell module to cause a reduction in strength or to produce acetic acid gas, which will affect solar cell elements. Thus, it is proposed that in place of EVA resin, polyolefin-based resin such as polyethylene should be used to form a sealing material for use in a solar cell module.

For example, Patent Document 1 discloses a sealing material layer containing a crosslinking agent and an ethylene-α-olefin copolymer obtained by polymerization using a single site catalyst. Patent Document 2 discloses a transparent, flame-retardant layer containing a crosslinking agent and a resin obtained by graft polymerization of polyethylene and an ethylenic unsaturated silane compound.

Patent Document 1: Japanese Unexamined Patent Application, Publication No. 2000-91611

Patent Document 2: Japanese Unexamined Patent Application, Publication No. 2009-10277

DISCLOSURE OF THE INVENTION

Problems to be Solved by the Invention

In general, the transparency or flexibility of a solar cell module-forming sealing material composed mainly of polyethylene-based resin can be improved by reducing its density. Unfortunately, there is a problem in that heat resistance rather decreases as the density decreases.

As disclosed in Patent Documents 1 and 2, it is known that heat resistance or flame retardancy can be provided when a crosslinking agent is used. To achieve such an object, however, crosslinking has to be performed sufficiently. In conventional techniques, a large amount of a crosslinking agent is added for this purpose. For example, Patent Document 1 discloses that a crosslinking agent is added in an amount of about 1%, and Patent Document 2 discloses that a crosslinking agent is added in such an amount that a gel fraction of 30% or more can be attained. In this case, heat resistance or flame retardancy can be increased reliably, but flexibility can be reduced. In addition, the film forming ability can decrease as the crosslinking proceeds during molding, which requires measures such as repeating the crosslinking reaction after molding at low temperature as disclosed in Patent Document 1.

An object of the invention, which has been made under the above circumstances, is to provide a solar cell module-forming sealing material that can be produced using polyethylene-based resin and can not only have a desired level of transparency and flexibility suitable for a solar cell module but also provide heat resistance, and to provide a method for producing such a sealing material.

Means for Solving the Problems

As a result of earnest study, the inventors have accomplished the invention based on the finding that when a polymerization initiator is added in an amount smaller than that for a common crosslinking treatment to low density polyethylene-based resin, a novel state can be formed, which is weakly crosslinked and increased in molecular weight (hereinafter, such a process is also referred to as "weak crosslinking"), and that while keeping the film forming ability, the weak crosslinking reaction is allowed to proceed successfully by heating during molding. More specifically, the invention provides the following.

(1) A sealing material for use in a solar cell module, including: a monolayer or multilayer film including a resin composition containing at least 90 mass % of a polyethylene-based resin with a density of at most 0.900 g/cm$^3$ and containing substantially no crosslinking coagent, wherein the monolayer or multilayer film has a MFR of from 0.1 g/10 min to 1.0 g/10 min as measured at 190° C. under a load of 2.16 kg according to JIS K 7210.

(2) The sealing material according to item (1) for use in a solar cell module, wherein the polyethylene-based resin is metallocene-type linear low density polyethylene.

(3) The sealing material according to item (1) or (2) for use in a solar cell module, wherein the polyethylene-based resin contains a copolymer obtained by copolymerization using an α-olefin and an ethylenic unsaturated silane compound as comonomers.

(4) The sealing material according to any one of items (1) to (3) for use in a solar cell module, which has a gel fraction of at most 25%.

(5) The sealing material according to any one of items (1) to (4) for use in a solar cell module, which has a polystyrene-equivalent weight average molecular weight of from 120,000 to 300,000.

(6) The sealing material according to any one of items (1) to (5) for use in a solar cell module, which has at least two layers different in the MFR.

(7) The sealing material according to item (6) for use in a solar cell module, wherein the layers include a layer with a relatively high MFR arranged as an outermost layer and another layer with a relatively low MFR arranged as an intermediate layer.

(8) A solar cell module having the sealing material for use in a solar cell module according to any one of items (1) to (7).

(9) A method for producing a sealing material for use in a solar cell module, including: melt molding a resin composition containing a polyethylene-based resin with a density of at most 0.900 g/cm$^3$ and 0.02 mass % to less than 0.5 mass % a polymerization initiator.

(10) The method according to item (9) for producing a sealing material for use in a solar cell module, wherein the composition contains 0.02 mass % to 0.2 mass % of the polymerization initiator.

(11) The method according to item (9) or (10) for producing a sealing material for use in a solar cell module, wherein the polymerization initiator is an organic peroxide.

(12) The method according to any one of items (9) to (11) for producing a sealing material for use in a solar cell module, wherein the melt molding is performed at a temperature at least 50° C. higher than the melting point of the polyethylene-based resin.

(13) The method according to any one of items (9) to (12) for producing a sealing material for use in a solar cell module, wherein the difference in the density of the resin composition between before and after the melt molding is at most 0.05 g/cm$^3$, and the difference in the MFR of the resin composition between before and after the melt molding is at least 1.0 g/10 min as measured at 190° C. under a load of 2.16 kg according to JIS K 7210.

(14) The method according to any one of items (9) to (13) for producing a sealing material for use in a solar cell module, wherein the sealing material has at least two layers different in the content of the polymerization initiator.

(15) The method according to item (14) for producing a sealing material for use in a solar cell module, wherein the layers include a layer with a relatively low polymerization initiator content arranged as an outermost layer and another layer with a relatively high polymerization initiator content arranged as an intermediate layer.

Effects of the Invention

The invention makes it possible to provide a solar cell module-forming sealing material that can be produced using polyethylene-based resin and can not only have a desired level of transparency and flexibility suitable for a solar cell module but also provide heat resistance, and to provide a method for producing such a sealing material.

EXPLANATION OF REFERENCE NUMERALS

1: Solar cell module
2: Transparent front substrate
3: Front sealing material layer
4: Solar cell element
5: Rear sealing material layer
6: Rear surface-protecting sheet

PREFERRED MODE FOR CARRYING OUT THE INVENTION

<Sealing Material Composition for Use in Forming Solar Cell Module>

The sealing material composition for producing the sealing material of the invention for use in a solar cell module (hereinafter, also simply referred to as the "sealing material composition") contains, as essential components, a polymerization initiator and a resin composition containing 90% or more of a polyethylene-based resin with a density of 0.900 g/cm$^3$ or less.

The sealing material of the invention for use in a solar cell module is a monolayer film made from the sealing material composition or a multilayer film including a laminate of layers each made from the sealing material composition. When the sealing material for use in a solar cell module is a multilayer film, the respective layers may be made from sealing material compositions different in component or component ratio, as long as each resin composition contains 90% or more of a polyethylene-based resin with a density of 0.900 g/cm$^3$.

[Polyethylene-Based Resin]

In the invention, low density polyethylene (LDPE) with a density of 0.900 g/cm$^3$ or less, preferably, linear low density polyethylene (LLDPE) with a density of 0.900 g/cm$^3$ or less is used as a base resin. The linear low density polyethylene may be a copolymer of ethylene and α-olefin, which has a density of 0.900 g/cm$^3$ or less, preferably has a density in the range of 0.870 to 0.890 g/cm$^3$ in the invention. Within this range, the resin can have a desired level of transparency and heat resistance while maintaining the ability to be formed into a sheet.

In the invention, metallocene-type linear low density polyethylene is preferably used. The metallocene-type linear low density polyethylene is synthesized using a metallocene catalyst, which is a single site catalyst. Such polyethylene contains few branched side chains and has a uniform distribution of comonomers. Thus, such polyethylene can have a narrow molecular weight distribution and a very low density as mentioned above. Such polyethylene can also have a narrow crystal distribution and contain crystals of uniform size, so that not only there is no large-sized crystal in it, but also its crystallinity is low because of its low density. Thus, such polyethylene has high transparency when formed into a sheet. Thus, the solar cell module-forming sealing material of the invention made from the sealing material composition causes almost no reduction in generating efficiency even when placed between a transparent front substrate and solar cell elements.

The linear low density polyethylene is preferably produced using an unbranched α-olefin. In particular, an α-olefin of 6 to 8 carbon atoms, such as 1-hexene, 1-heptene, or 1-octene is preferably used. When an α-olefin of 6 to 8 carbon atoms is used, a desired level of flexibility and strength can be imparted to the solar cell module-forming sealing material. As a result, the adhesion between the solar cell module-forming sealing material and the substrate can be increased, so that entrance of water between the solar cell module-forming sealing material and the substrate can be prevented.

The polyethylene-based resin preferably has a melt mass flow rate (MFR) of from 1.0 g/10 min to 40 g/10 min, more preferably from 2 g/10 min to 40 g/10 min, as measured at 190° C. under a load of 2.16 kg. The polyethylene-based resin with a MFR in the above range has high processability during the process of forming the sealing material film for use in a solar cell module.

The term "MFR" as used herein, unless otherwise specified, refers to the value obtained by the method described below.

MFR (g/10 min) is measured according to JIS K 7210. More specifically, synthetic resin is heated and pressurized at 190° C. in a cylindrical vessel heated by a heater, and the amount of the resin extruded per 10 minutes from an opening (nozzle) formed at the bottom of the vessel is measured. The testing machine used is an extrusion plastometer, and the extrusion load is 2.16 kg.

Concerning a sealing material sheet made of a multilayer film, the above measurement process is performed on a multilayer state in which all layers are laminated, and the resulting measured value is used as the MFR value of the multilayer sealing material sheet.

In the invention, the "polyethylene-based resin" is intended to include not only common polyethylene obtained by polymerization of ethylene but also resin obtained by polymerization of an ethylenic unsaturated bond-containing compound such as α-olefin, resin obtained by copolymerization of different compounds each having an ethylenic unsaturated bond, and modified resins obtained by grafting other chemical species onto these resins.

In particular, a silane copolymer obtained by copolymerization using at least an α-olefin and an ethylenic unsaturated silane compound as comonomers may be preferably used. When such resin is used, adhesion can be achieved between the solar cell module-forming sealing material and a member such as a transparent front substrate or a solar cell element.

For example, the silane copolymer is described in Japanese Unexamined Patent Application, Publication No. 2003-46105. The use of the copolymer as a component of the solar cell module-forming sealing material composition makes it possible to reliably and inexpensively manufacture a solar cell module having a high level of strength, durability, weather resistance, heat resistance, water resistance, light resistance, wind pressure resistance, hail resistance, and other properties, having excellent heat sealability not vulnerable to solar cell module-manufacturing conditions such as thermocompression bonding conditions, and being suitable for use in a variety of applications.

The silane copolymer is intended to include a copolymer obtained by copolymerization using at least an α-olefin and an ethylenic unsaturated silane compound as comonomers and optionally any other unsaturated monomer as a comonomer and include a product of modification or condensation of such a copolymer.

More specifically, for example, one or more α-olefins and one or more ethylenic unsaturated silane compounds and optionally one or more other unsaturated monomers may be simultaneously or stepwisely subjected to random copolymerization using a suitable reaction vessel, for example, under the conditions of a pressure of about 500 to about 4,000 kg/cm$^2$, preferably about 1,000 to 4,000 kg/cm$^2$ and a temperature of about 100 to 400° C., preferably about 150 to about 350° C. in the presence of a radical polymerization initiator and optionally a chain transfer agent, and optionally, silane compound moieties of the resulting random copolymer may be modified or condensed, so that a copolymer of the α-olefin and the ethylenic unsaturated silane compound or a product of modification or condensation of the copolymer can be produced.

Alternatively, for example, a copolymer of an α-olefin and an ethylenic unsaturated silane compound or a product of modification or condensation of the copolymer may be produced by a process including subjecting one or more α-olefins and optionally one or more other unsaturated monomers to simultaneous or stepwise polymerization using a suitable reaction vessel in the presence of a radical polymerization initiator and optionally a chain transfer agent as described above, then subjecting the resulting polyolefin polymer to graft polymerization of one or more ethylenic unsaturated silane compounds, and optionally modifying or condensing silane compound moieties of the resulting graft copolymer.

For example, the α-olefin may be one or more selected from ethylene, propylene, 1-butene, isobutylene, 1-pentene, 2-methyl-1-butene, 3-methyl-1-butene, 1-hexene, 1-heptene, 1-octene, 1-nonene, and 1-decene.

For example, the ethylenic unsaturated silane compound may be one or more selected from vinyltrimethoxysilane, vinyltriethoxysilane, vinyltripropoxysilane, vinyltriisopropoxysilane, vinyltributoxysilane, vinyltripentyloxysilane, vinyltriphenoxysilane, vinyltribenzyloxysilane, vinyltrimethylenedioxysilane, vinyltriethylenedioxysilane, vinylpropionyloxysilane, vinyltriacetoxysilane, and vinyltricarboxysilane.

For example, one or more selected from vinyl acetate, acrylic acid, methacrylic acid, methyl acrylate, methyl methacrylate, ethyl acrylate, and vinyl alcohol may be used as other unsaturated monomers.

Examples of radical polymerization initiators that may be used include organic peroxides such as lauroyl peroxide, dipropionyl peroxide, benzoyl peroxide, di-tert-butyl peroxide, tert-butyl hydroperoxide, and tert-butyl peroxybutyrate, molecular oxygen, and azo compounds such as azobisisobutyronitrile and azoisobutylvaleronitrile.

Examples of chain transfer agents that may be used include paraffin hydrocarbons such as methane, ethane, propane, butane, and pentane, α-olefins such as propylene, 1-butene, and 1-hexene, aldehydes such as formaldehyde, acetaldehyde, and n-butyl aldehyde, ketones such as acetone, methyl ethyl ketone, and cyclohexanone, aromatic hydrocarbons, and chlorinated hydrocarbons.

For example, a method for modification or condensation of silane compound moieties of a random copolymer or a graft copolymer may include carrying out a dehydration condensation reaction between silanol groups of silane compound moieties of a random or graft copolymer of an α-olefin and an ethylenic unsaturated silane compound using a silanol condensation catalyst such as a carboxylate of a metal such as tin, zinc, iron, lead, or cobalt, an organometallic compound such as a titanate or a chelate compound, an organic base, an inorganic acid, or an organic acid, so that a product of modification or condensation of the copolymer of an α-olefin and an ethylenic unsaturated silane compound is obtained.

The silane copolymer to be used is preferably any of a random copolymer, an alternating copolymer, a block copolymer, and a graft copolymer, more preferably a graft copolymer, even more preferably a graft copolymer having a polyethylene main chain for polymerization and an ethylenic unsaturated silane compound-derived side chain grafted to the main chain. Such a graft copolymer, in which silanol groups contributable to adhesive strength have a high degree of freedom, can increase the adhesion of the solar cell module-forming sealing material to other components of the solar cell module.

The content of the ethylenic unsaturated silane compound component in the copolymer of the α-olefin and the ethylenic unsaturated silane compound is typically from about 0.001 to about 15 mass %, preferably from about 0.01 to about 5 mass %, in particular, preferably from about 0.05 to about 2 mass %, based on the total weight of the copolymer. In the invention, if the content of the ethylenic unsaturated silane compound component in the copolymer of the α-olefin and the ethylenic unsaturated silane compound is high, a high level of mechanical strength and heat resistance can be provided, but if it is too high, tensile elongation, heat sealability, or other properties will tend to be low.

The content of the polyethylene-based resin with a density of 0.900 g/cm$^3$ or less in the sealing material composition should be 90 mass % or more, preferably 99.9 mass % or more. Within such a range, the composition may contain any other resin. For example, any other resin may be any other polyethylene-based resin with a density of more than 0.900 g/cm$^3$. For example, such resins may be used as additive resins, or may be used together with other components to form a master batch as described below.

[Polymerization Initiator]

In the invention, the content of the polymerization initiator in the solar cell module-forming sealing material composition is within the specified range, which is lower than that for a general process of crosslinking a conventionally known sealing material composition for a solar cell module. The content of the polymerization initiator in the solar cell module-forming sealing material composition is from 0.02 mass % to less than 0.5 mass %, preferably up to 0.2 mass % or less, more preferably up to 0.1 mass % or less. If the content is less than the above range, week crosslinking of the polyethylene-based resin cannot proceed so that heat resistance will be insufficient. If the content is more than the above range, gelation or the like can occur during molding so that the film forming ability and transparency will be degraded.

Any known polymerization initiator may be used, such as a known radical polymerization initiator. Examples of radical polymerization initiators include organic peroxides including hydroperoxides such as diisopropylbenzene hydroperoxide and 2,5-dimethyl-2,5-di(hydroperoxy) hexane; dialkyl peroxides such as di-tert-butyl peroxide, tert-butylcumyl peroxide, dicumyl peroxide, 2,5-dimethyl-2,5-di(tert-butylperoxy)hexane, and 2,5-dimethyl-2,5-di (tert-peroxy)hexyne-3; diacyl peroxides such as bis-3,5,5-trimethylhexanoyl peroxide, octanoyl peroxide, benzoyl peroxide, o-methylbenzoyl peroxide, and 2,4-dichlorobenzoyl peroxide; peroxyesters such as tert-butyl peroxyacetate, tert-butyl-tert-ethyl hexanoate, tert-butyl peroxypivalate, tert-butyl peroxyoctoate, tert-butyl peroxyisopropyl carbonate, tert-butyl peroxybenzoate, di-tert-butyl peroxyphthalate, 2,5-dimethyl-2,5-di(benzoylperoxy)hexane, 2,5-dimethyl-2,5-di(benzoylperoxy)hexyne-3, and tert-butylperoxy-2-ethylhexyl carbonate; ketone peroxides such as methyl ethyl ketone peroxide and cyclohexanone peroxide; and peroxycarbonates such as tert-amyl-peroxy-2-ethylhexyl carbonate and tert-butylperoxy-2-ethylhexyl carbonate; or azo compounds such as azobisisobutyronitrile and azobis(2,4-dimethylvaleronitrile); and silanol condensation catalysts such as dibutyltin diacetate, dibutyltin dilaurate, dibutyltin dioctate, dioctyltin dilaurate, and dicumyl peroxide.

Among the above, tert-butylperoxy-2-ethylhexyl carbonate and 2,5-dimethyl-2,5-di(tert-butylperoxy)hexane are preferably used. These have a high active hydrogen amount of 5% or more and also have a one-minute half-life temperature of 160 to 190° C. when used as a polymerization initiator. Thus, these are preferred because these can be consumed during molding, so that unnecessary later crosslinking can be prevented, which would otherwise be caused by a residue after molding. If the one-minute half-life temperature is less than 160° C., it can be difficult to allow the crosslinking reaction to proceed after the polymerization initiator is sufficiently dispersed during molding, which is not preferred.

[Crosslinking Coagent]

The invention uses no crosslinking coagent in contrast to a general crosslinking treatment. In this context, the crosslinking coagent is typically a polyfunctional vinyl monomer and/or a polyfunctional epoxy monomer, examples of which include polyallyl compounds such as triallyl isocyanurate (TAIC), triallyl cyanurate, diallyl phthalate, diallyl fumarate, and diallyl maleate; poly(meth)acryloxy compounds such as trimethylolpropane trimethacrylate (TMPT), trimethylolpropane triacrylate (TMPTA), ethylene glycol diacrylate, ethylene glycol dimethacrylate, 1,4-butanediol diacrylate, 1,6-hexanediol diacrylate, and 1,9-nonanediol diacrylate; and epoxy compounds such as glycidyl methacrylate and 4-hydroxybutyl acrylate glycidyl ether, which contain a double bond and an epoxy group, and 1,6-hexanediol diglycidyl ether, 1,4-butanediol diglycidyl ether, cyclohexanedimethanol diglycidyl ether, and trimethylolpropane polyglycidyl ether, which contain two or more epoxy groups.

As used herein, the term "substantially no crosslinking coagent" means that within the scope of the invention, the composition may contain any crosslinking coagent in such an amount as to show no crosslinking effect like impurities, and for example, the content of such a crosslinking coagent in the composition is less than 0.01 mass %.

[Other Components]

The solar cell module-forming sealing material composition may further contain other components. Examples of other components include a weather-resistant master batch for imparting weather resistance to the solar cell module-forming sealing material of the invention made from the solar cell module-forming sealing material composition, various fillers, a light stabilizer, an ultraviolet absorbing agent, a thermal stabilizer, etc. The content of each of these components in the solar cell module-forming sealing material composition is preferably in the range of 0.001 to 5 mass %, depending on the particle shape, density, or other factors. These additives can impart long-term stable mechanical strength or the property of preventing yellowing, cracking, or the like to the solar cell module-forming sealing material composition.

The weather-resistant master batch may be a dispersion of a light stabilizer, an ultraviolet absorbing agent, a thermal stabilizer, and the antioxidant or the like in resin such as polyethylene. When this is added to the sealing material composition, good weather resistance can be imparted to the solar cell module-forming sealing material. The weather-resistant master batch may be produced and used as needed, or a commercially available product may be used as the weather-resistant master batch. The resin for use in the weather-resistant master batch may be linear low density polyethylene for use in the invention, or any other resin as described above.

The light stabilizer, ultraviolet absorbing agent, thermal stabilizer, and antioxidant may be used alone or in combination of two or more.

Besides the above, other components for use in the composition for the solar cell module-forming sealing material of the invention may further include an adhesion improving agent such as a silane coupling agent, a nucleating agent, a dispersing agent, a leveling agent, a plasticizer, an anti-foaming agent, a flame retardant, etc.

<Sealing Material for Use in Solar Cell Module>

The sealing material for use in a solar cell module (hereinafter, also simply referred to as the "sealing material sheet") can be obtained in the form of a monolayer or multilayer sheet or film by subjecting the sealing material composition to a weak crosslinking treatment as described above during a conventionally known molding process. As used herein, the term "sheet" is intended to include not only a sheet but also a film, and there is no difference between both forms.

The sealing material sheet can be formed by various molding methods commonly used for molding thermoplastic resin, such as injection molding, extrusion molding, blow molding, compression molding, and rotational molding. An exemplary method for forming a multilayer sealing material sheet or film includes performing coextrusion molding using two or more melt kneading/extruding machines. In any method, the molding temperature is preferably at least 50° C. higher than the melting point of the polyethylene-based resin in order to accelerate the weak crosslinking reaction during the molding. More specifically, the molding temperature is preferably a high temperature of 150 to 250° C., more preferably in the range of 190 to 230° C. As described above, since the polymerization initiator is added in a relatively small amount in the invention, the level of the reduction in MFR is low even if MFR is reduced. Thus, weak crosslinking is allowed to proceed successfully during melt molding. A novel feature of the invention is based on the finding that weak crosslinking of the polyethylene-based resin can proceed even when the polymerization initiator is used in a relatively small amount with substantially no crosslinking coagent. Since the molding temperature is equal to or higher than the one-minute half-life temperature of the polymerization initiator, almost no residue of the polymerization initiator remains after the molding. Thus, the weak crosslinking is completed at the molding stage.

With respect to the physical properties, the solar cell module-forming sealing material of the invention weakly crosslinked as described above is characterized in that (i) it still has a low density and (ii) it has sufficient film forming ability as well as improved heat resistance. Concerning the characteristic (i), the density of the solar cell module-forming sealing material of the invention is about 0.900 g/cm$^3$ or less, which is not higher than and substantially equal to the density of the low density polyethylene-based resin used as a main raw material, and the difference in the density of the resin composition between before and after the melt molding is 0.05 g/cm$^3$ or less. Thus, the transparency is still maintained.

Concerning the heat resistance (ii), the MFR is from 0.1 g/10 min to less than 1.0 g/10 min, and the difference in the MFR of the resin composition between before and after the melt molding is preferably from 1.0 g/10 min to 10.0 g/10 min, so that heat resistance is improved within the MFR range where molding is possible. This is an advantageous effect of the weak crosslinking treatment in the invention. In general, there is a positive correlation between the MFR and density of resin. Nevertheless, without changing the density, the invention makes it possible to slightly increase the MFR within the MFR range where molding is possible. Thus, the weakly crosslinked sealing material of the invention is a novel product.

The result of the weak crosslinking treatment is also understandable from the gel fraction of the product. The solar cell module-forming sealing material of the invention has a gel fraction of 25% or less, preferably 10% or less, more preferably within 0% and 1%. This indicates that the weak crosslinking treatment according to the invention is fundamentally different from the conventional technical idea such as that disclosed in Patent Document 2, which imparts flame retardancy by performing a crosslinking treatment in such a manner that a gel fraction of 30% or more is attained. As used herein, the gel fraction is the value obtained by the method described below.

Gel fraction (%): After crosslinked, 1 g of the sealing material is weighed and placed in an 80-mesh metal gauze bag. Subsequently, the sample in the metal gauze is added to a Soxhlet extractor and refluxed with xylene at the boiling point. After continuous extraction for 10 hours, the sample in the metal gauze bag is taken out, and the sample is dried and then weighed. The weights of the sample before and after the extraction are compared to determine the mass percentage (%) of the insoluble residue, which is used as the gel fraction. The gel fraction of the sealing material in the form of a multilayer film is determined as follows. The multilayer product in which all layers are laminated together is subjected to the above process, and the resulting measured value is used as the gel fraction of the multilayer sealing material sheet.

Another side of the weak crosslinking treatment can also be identified in terms of molecular weight. The solar cell module-forming sealing material of the invention has a polystyrene-equivalent weight average molecular weight of from 120,000 to 300,000, and the ratio of the weight average molecular weight of the weakly crosslinked sealing material to the weight average molecular weight of the uncrosslinked polyethylene-based resin is in the range of from 1.5 to 3.0. This also indicates that a macromolecule is formed but a dense crosslinked structure is not formed, while a weakly crosslinked structure is formed. In the invention, the weight average molecular weight is determined by a process including measuring the viscosity of a xylene solution of 6 wt % of the sample and determining the weight average molecular weight of the sample from the viscosity by conversion calculation using a polystyrene standard. For the molecular weight of the sealing material sheet in the form of a multilayer film, the multilayer product in which all layers are laminated together is subjected to the above process, and the resulting measured value is used as the gel fraction of the multilayer sealing material sheet.

When the sealing material sheet is in the form of a multilayer film, the layers of the sheet preferably have different MFRs. As described below, the sealing material sheet is generally used in such a manner that one surface of the sheet is brought into intimate contact with the electrode surface of solar cell elements in a solar cell module. In such a case, the sealing material sheet is required to have high adhesion regardless of irregularities on the electrode surface. The monolayer sealing material sheet of the invention has a desired level of transparency, flexibility, and heat resistance. In addition, it is more preferred that the sealing material surface to be brought into intimate contact with the electrode surface of solar cell elements should have such high molding properties. The sealing material sheet of the invention in the form of a multilayer film having layers with different MFRs may be so structured that a higher-MFR layer is arranged as the outermost layer to be brought into intimate contact with the electrode surface of solar cell elements. In this case, while keeping a desired level of transparency and heat resistance, the sealing material sheet can have a surface with higher molding properties to be brought into intimate contact with solar cell elements.

For example, the sealing material sheet in the form of a multilayer film having three or more layers is preferably such that the outermost layer has a thickness of from 30 μm to 120 μm and the thickness ratio of the outermost/intermediate/outermost layers is in the range of 1/3/1 to 1/8/1, wherein the intermediate layer is composed of the other layer or layers than the outermost layers. The sealing material with such a structure can have a desired level of heat resistance. At the same time, the outermost layer of the sealing material can have a desired level of molding properties, and such a structure can also keep the manufacturing cost at a low level.

<Solar Cell Module>

Figure 1:
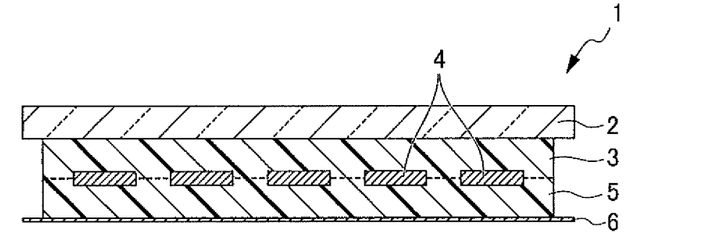
FIG. 1 is a cross-sectional view showing an example of the layered structure of a solar cell module according to the invention.

Next, an example of the solar cell module of the invention is described with reference to the drawing. FIG. 1 is a cross-sectional view showing an example of the layered structure of a solar cell module according to the invention. The solar cell module 1 according to the invention includes a transparent front substrate 2, a front sealing material layer 3, solar cell elements 4, a rear sealing material layer 5, and a rear surface-protecting sheet 6, which are laminated in this order from the incident light receiving surface side. In the solar cell module 1 according to the invention, the solar cell module-forming sealing material described above is used to form at least one of the front sealing material layer 3 and the rear sealing material layer 5.

For example, the solar cell module 1 may be manufactured by a process including sequentially stacking members including the transparent front substrate 2, the front sealing material layer 3, the solar cell elements 4, the rear sealing material layer 5, and the rear surface-protecting sheet 6, integrating the members by means of vacuum aspiration or the like, and then subjecting the members to a molding process such as a lamination process so that an integrated molded product is obtained by thermocompression bonding and molding.

Alternatively, the solar cell module 1 may be manufactured by a process including melt-laminating the front sealing material layer 3 and the rear sealing material layer 5 to the front and rear sides of the solar cell elements 4, respectively, by a molding process normally used for general thermoplastic resin, such as T-die extrusion molding, so that the solar cell elements 4 are sandwiched between the front sealing material layer 3 and the rear sealing material layer 5, then sequentially stacking the transparent front substrate 2 and the rear surface-protecting sheet 6, and then integrating the members by means of vacuum aspiration or the like, and subjecting the members to thermocompression bonding.

In the solar cell module 1 according to the invention, conventionally known materials may be used without restriction for the transparent front substrate 2, the solar cell elements 4, and the rear surface-protecting sheet 6, which are other members than the front sealing material layer 3 and the rear sealing material layer 5. The solar cell module 1 according to the invention may also include any other member than the above members. The sealing material sheet of the invention may be used not only in a single crystalline solar cell module but also in a thin film solar cell module or any other solar cell module.

EXAMPLES

Hereinafter, the invention is more specifically described with reference to the examples, which however are not intended to limit the invention.

Test Example 1

<Production of Sealing Material for Use in Solar Cell Module>

(Monolayer Film)

The components for the sealing material composition shown in Table 1 below were mixed to form a blend for a monolayer. The blend was formed into a solar cell module-forming monolayer sealing material with a total thickness of 600 μm at an extrusion temperature of 210° C. and a drawing rate of 1.1 m/minute using a 30 mmϕ extruder and a film forming machine having a 200 mm wide T die (Examples 1-5, Comparative Examples 1-4, and Reference Examples 1 and 2). In Reference Examples 1 and 2, the film was formed using the same composition as the composition for each of the inner and outer layers of the multilayer film described below.

(Multilayer Film)

The components for the sealing material compositions shown in Table 2 below were mixed to form blends for inner and outer layers, respectively, which were used to form a three-layer film. Each blend was formed into a film at an extrusion temperature of 210° C. and a drawing rate of 1.1 m/minute using a 30 mmϕ extruder and a film forming machine having a 200 mm wide T die, and the resulting films were laminated to form a three-layer sealing material for a solar cell module. The sealing material had a total thickness of 600 μm and a thickness ratio of outer/inner/outer layers of 1/5/1 (Example 6).

The raw materials shown below were used for the sealing material compositions.

Silane-modified transparent resin (Si): 2 parts by weight of vinyltrimethoxysilane and 0.1 parts by weight of dicumyl peroxide as a radical precursor (reaction catalyst) were mixed into 98 parts by weight of metallocene-type linear low density polyethylene (M-LLDPE) with a density of 0.881 g/cm$^3$ and a MFR of 2 g/10 min at 190° C. The mixture was melted and kneaded at 200° C. to give silane-modified transparent resin with a density of 0.884 g/cm$^3$ and a MFR of 1.8 g/10 min at 190° C.

Weather-resistant master batch (weatherproof): Into 100 parts by weight of powder obtained by grinding Ziegler linear low density polyethylene with a density of 0.880 g/cm$^3$ were mixed 3.8 parts by weight of a benzophenol ultraviolet absorber, 5 parts by weight of a hindered amine light stabilizer, and 0.5 parts by weight of a phosphorous thermal stabilizer. The mixture was melted and processed to form a pelletized master batch.

Polymerization initiator compound resin 1 (Poly 1): 100 parts by weight of M-LLDPE pellets with a density of 0.880 g/cm$^3$ and a MFR of 3.1 g/10 min at 190° C. were impregnated with 0.1 parts by weight of tert-amyl-peroxy-2-ethyl-hexyl carbonate (polymerization initiator A) so that compound pellets were obtained.

Polymerization initiator compound resin 2 (Poly 2): 100 parts by weight of M-LLDPE pellets with a density of 0.880 g/cm$^3$ and a MFR of 2.2 g/10 min at 190° C. were impregnated with 0.1 parts by weight of tert-amyl-peroxy-2-ethyl-hexyl carbonate (polymerization initiator A) so that compound pellets were obtained.

Polymerization initiator compound resin 3 (Poly 3): 100 parts by weight of M-LLDPE pellets with a density of 0.880 g/cm³ and a MFR of 3.1 g/10 min at 190° C. were impregnated with 0.1 parts by weight of tert-butyl-peroxy-2-ethyl-hexyl carbonate (polymerization initiator B) so that compound pellets were obtained.

Polymerization initiator compound resin 4 (Poly 4): 100 parts by weight of M-LLDPE pellets with a density of 0.880 g/cm³ and a MFR of 2.2 g/10 min at 190° C. were impregnated with 0.1 parts by weight of tert-butyl-peroxy-2-ethyl-hexyl carbonate (polymerization initiator B) so that compound pellets were obtained.

Polymerization initiator compound resin 5 (Poly 5): 100 parts by weight of M-LLDPE pellets with a density of 0.880 g/cm³ and a MFR of 3.1 g/10 min at 190° C. were impregnated with 0.032 parts by weight of 2,5-dimethyl-2,5-di(tert-butylperoxy)hexane (polymerization initiator C) so that compound pellets were obtained.

Polymerization initiator compound resin 6 (Poly 6): 100 parts by weight of M-LLDPE pellets with a density of 0.880 g/cm³ and a MFR of 3.5 g/10 min at 190° C. were impregnated with 0.032 parts by weight of 2,5-dimethyl-2,5-di(tert-butylperoxy)hexane (polymerization initiator C) so that compound pellets were obtained.

Polymerization initiator compound resin 7 (Poly 7): 100 parts by weight of M-LLDPE pellets with a density of 0.880 g/cm³ and a MFR of 3.5 g/10 min at 190° C. were impregnated with 0.041 parts by weight of 2,5-dimethyl-2,5-di(tert-butylperoxy)hexane (polymerization initiator C) so that compound pellets were obtained.

M-LLDPE 1 (ML 1): metallocene-type linear low density polyethylene with a density of 0.880 g/cm³ and a MFR of 3.1 g/10 min at 190° C.

M-LLDPE 2 (ML 2): metallocene-type linear low density polyethylene with a density of 0.880 g/cm³ and a MFR of 1.0 g/10 min at 190° C.

M-LLDPE 3 (ML 3): metallocene-type linear low density polyethylene with a density of 0.901 g/cm³ and a MFR of 2.0 g/10 min at 190° C.

Concerning film forming ability, the compositions of the examples and the comparative examples shown in Table 1 were each normally formed into a film (the content of the polymerization initiator in the composition was 0.076% in Examples 1-4 and 0.024% in Example 5). The composition of Comparative Example 4 was prepared as in Example 1, except that the amount of the polymerization initiator was 0.7 parts by weight (the content of it in the composition was 0.53%). However, it was impossible to form the composition of Comparative Example 4 into a film because due to the high MFR, gelation occurred.

TABLE 2

|  |  | Si | Weatherproof | Poly6 | Poly7 |
|---|---|---|---|---|---|
| Example6 | Inner layer | 3 | 5 |  | 97 |
|  | Outer layer | 20 | 5 | 80 | 97 |

(Unit: parts by mass)

Evaluation Example 1

The solar cell module-forming sealing materials of Examples 1 to 6, Comparative Examples 1 to 3, and Reference Examples 1 and 2 produced by the above method were each evaluated for total light transmittance (JIS K 6911), haze (JIS K 6911), heat resistance test, load current during molding, and multilayer film molding properties. Higher load current means larger load during extrusion. The results are shown in Tables 3 and 4. Good molding properties mean that high adherence performance is provided when a module is formed.

Heat resistance test: Two 75 mm×50 mm cut pieces of the solar cell module-forming sealing material of each of the examples and the comparative examples, and one 75 mm×50 mm piece of semi-reinforced glass plate were stacked in this order on a 250 mm square semi-reinforced glass plate, and subjected to pressure bonding at 150° C. for 15 minutes using a vacuum laminator for forming a solar cell module. The resulting laminate sample was allowed to stand for 12 hours in an oven at 120° C. while inclined at 45°, and the distance that the semi-reinforced glass plate shifted was used to evaluate the heat resistance.

Adherence test: A 150 mm square cut piece of the solar cell module-forming sealing material of each of Example 6 and Comparative Examples 1 and 2 was sandwiched between two 150 mm blue glass sheets, while a 10 mm-wide, 100 mm-long, 300 μm-thick aluminum tape was attached to one inner side of the blue glass sheet, and the materials were subjected to vacuum lamination. The resulting laminate sample was allowed to stand in a 4° C. environment for 1 week, and then, the presence or absence of delamination around the aluminum tape was determined. If the molding properties are poor, the strength of lamination will be low so that delamination will occur under the above conditions. Thus, the presence or absence of delamination was used to determine whether the molding properties are good or poor. For the solar cell module-forming sealing material of each of Example 6 and Reference Examples 1 and 2, the MFR was measured in advance.

TABLE 1

|  | Si | Weatherproof | Poly1 | Poly2 | Poly3 | Poly4 | Poly5 | Poly6 | Poly7 | ML1 | ML2 | ML3 |
|---|---|---|---|---|---|---|---|---|---|---|---|---|
| Example1 | 20 | 5 | 80 |  |  |  |  |  |  |  |  |  |
| Example2 | 20 | 5 |  | 80 |  |  |  |  |  |  |  |  |
| Example3 | 20 | 5 |  |  | 80 |  |  |  |  |  |  |  |
| Example4 | 20 | 5 |  |  |  | 80 |  |  |  |  |  |  |
| Example5 | 20 | 5 |  |  |  |  | 80 |  |  |  |  |  |
| Comparative Example1 | 20 | 5 |  |  |  |  |  |  |  | 80 |  |  |
| Comparative Example2 | 20 | 5 |  |  |  |  |  |  |  |  | 80 |  |
| Comparative Example3 | 20 | 5 |  |  |  |  |  |  |  |  |  | 80 |
| Reference Example 1 (for inner layer) | 3 | 5 |  |  |  |  |  | 97 |  |  |  |  |
| Reference Example 2 (for outer layer) | 20 | 5 |  |  |  |  | 80 |  |  |  |  |  |

(Unit: parts by mass)

TABLE 3

| | Total light transmittance (%) | Haze (%) | Heat resistance test (mm) | Load current during production (A) |
|---|---|---|---|---|
| Example1 | 91 | 5 | 2.2 | 14.8 |
| Example2 | 91 | 5 | 1.2 | 15.8 |
| Example3 | 91 | 5 | 2.2 | 14.8 |
| Example4 | 91 | 5 | 1.2 | 15.8 |
| Example5 | 91 | 5 | 2.3 | 14.7 |
| Example 6 (multilayer) | 91 | 5 | 1.5 | Not measured |
| Comparative Example1 | 91 | 5 | 47.9 | 13.8 |
| Comparative Example2 | 91 | 9 | 23 | 16.2 |
| Comparative Example3 | 91 | 20 | 2.1 | 14.5 |
| Reference Example 1 (for inner layer) | 91 | 5 | 1.3 | Not measured |
| Reference Example 2 (for outer layer) | 91 | 5 | 2.3 | Not measured |

Table 3 indicates that the solar cell module-forming sealing materials according to the invention, which are weakly crosslinked by molding at a temperature equal to or higher than the one-minute half-life temperature of the polymerization initiator, possess higher heat resistance because they show lower values in the heat resistance test and superior processability because they show lower load currents than the material produced using non-crosslinked resin with a low MFR (Comparative Example 2). The solar cell module-forming sealing materials according to the invention also possess higher transparency than the material produced using non-crosslinked resin with a higher density (Comparative Example 3). Thus, the results indicate that according to the invention, the weak crosslinking during molding can improve heat resistance while keeping the transparency and film forming ability of low density polyethylene.

TABLE 4

| | MFR (g/10 min) | Molding properties (presence or absence of delamination) |
|---|---|---|
| Example6 | 0.4 | Good (absent) |
| Reference Example1 | 0.32 | Poor (present) |
| Reference Example2 | 0.64 | Good (absent) |

Tables 3 and 4 indicate that if a plurality of weakly crosslinked sealing material sheets are used to form a multilayer film, sheets with different MFRs can be used in such a manner that a higher-MFR layer is arranged as an outer layer while a lower-MFR layer is arranged as an inner layer, so that adherence can be improved while heat resistance is kept at the same level as that of the monolayer film having a similar composition.

Evaluation Example 2

Concerning Example 2, Table 5 shows the results of determining whether the density, MFR, and weight average molecular weight were changed before and after the film production.

TABLE 5

| | Density | | MFR | | Molecular weight | | Gel fraction | |
|---|---|---|---|---|---|---|---|---|
| | Before film production | After film production | Before film production | After film production | Before film production | After film production | Before film production | After film production |
| Example2 | 0.88 | 0.883 | 2.2 | 0.2 | 99,700 | 214,000 | 0 | 0 |

It is apparent from Table 5 that in Example 2, there is almost no change in density before and after the film production, and since the gel fraction is zero, crosslinkage is not detectable from the gel fraction. Nevertheless, after the film production, the MFR decreases, while the weight average molecular weight increases, which indicates that weak crosslinking is achieved according to the invention.

Test Example 2

Polymerization initiator compound resins were prepared as follows. 100 parts by weight of M-LLDPE pellets with a density of 0.880 g/cm$^3$ and a MFR of 3.5 g/10 min at 190° C. were impregnated with each of four levels of α,α'-di(tert-butylperoxy)diisopropylbenzene (polymerization initiator D): 0 parts by weight (Comparative Example 5), 0.01 parts by weight (Comparative Example 6), 0.04 parts by weight (Example 7), and 0.05 parts by weight (Example 8) of polymerization initiator D, so that compound pellets were obtained. Film production was performed as in Example 1 using only each compound resin. Table 6 shows the results of the measurement of the MFR at 190° C. after the film production.

TABLE 6

| | MFR (g/10 min) |
|---|---|
| Comparative Example5 | 3.50 |
| Comparative Example6 | 3.42 |
| Example6 | 0.59 |
| Example7 | 0.33 |

The results indicate that silane-modified transparent resin is not essential when polyethylene-based resin is used according to the invention and that even in the absence of silane-modified transparent resin, MFR can be reduced, and a weak crosslinking treatment can be achieved.

The invention claimed is:

1. A method for producing a sealing material for use in a solar cell module, comprising: melt molding a resin composition containing a polyethylene-based resin with a density of at most 0.900 g/cm$^3$ and 0.02 mass % to less than 0.5 mass % of a polymerization initiator,
wherein:
the melt molding is performed at a temperature at least 50° C. higher than the melting point of the polyethylene-based resin,
a difference in the density of the resin composition between before and after the melt molding is at most 0.05 g/cm$^3$, and
a difference in the MFR of the resin composition between before and after the melt molding is at least 1.0 g/10 min as measured at 190° C. under a load of 2.16 kg according to JIS K 7210.

2. A method for manufacturing the sealing material for use in a solar cell module according to claim 1, wherein cross-linking treatment for forming a macromolecule is performed to increase a weight average molecular weight of the polyethylene-based resin within a range of 1.5 to 3.0 times without increasing a gel fraction of the polyethylene-based resin.

3. A method for manufacturing the sealing material for use in a solar cell module according to claim 1, wherein a ratio of a weight average molecular weight of the polyethylene-based resin after the melt molding to a weight average molecular weight of the polyethylene-based resin before the melt molding is 1.5 to 3.0.

4. A method for manufacturing the sealing material for use in a solar cell module according to claim 1, wherein a density of the resin composition after the melt molding is at most 0.900 g/cm$^3$.

5. A method for manufacturing the sealing material for use in a solar cell module according to claim 1, wherein the MFR of the resin composition after the melt molding is from 0.1 g/10 min to 1.0 g/10 min as measured at 190° C. under a load of 2.16 kg according to JIS K 7210.

6. A method for manufacturing the sealing material for use in a solar cell module according to claim 1, wherein a weight average molecular weight of the polyethylene-based resin after the melt molding is 120,000 to 300,000.

7. A method for manufacturing the sealing material for use in a solar cell module according to claim 1, wherein a content of the polyethylene-based resin in the resin composition is 99.9 mass % or more.

8. A method for producing a sealing material for use in a solar cell module, comprising: melt molding a resin composition containing a polyethylene-based resin with a density of at most 0.900 g/cm$^3$ and 0.02 mass % to less than 0.5 mass % of a polymerization initiator, wherein the sealing material has at least two layers different in polymerization initiator content.

9. A method for manufacturing the sealing material for use in a solar cell module according to claim 8, wherein cross-linking treatment for forming a macromolecule is performed to increase a weight average molecular weight of the polyethylene-based resin within a range of 1.5 to 3.0 times without increasing a gel fraction of the polyethylene-based resin.

10. A method for manufacturing the sealing material for use in a solar cell module according to claim 8, wherein a ratio of a weight average molecular weight of the polyethylene-based resin after the melt molding to a weight average molecular weight of the polyethylene-based resin before the melt molding is 1.5 to 3.0.

11. The method for producing a sealing material for use in a solar cell module according to claim 8, wherein a difference in the density of the resin composition between before and after the melt molding is at most 0.05 g/cm$^3$.

12. The method for producing a sealing material for use in a solar cell module according to claim 8, wherein a difference in the MFR of the resin composition between before and after the melt molding is at least 1.0 g/10 min as measured at 190° C. under a load of 2.16 kg according to JIS K 7210.

13. The method for producing a sealing material for use in a solar cell module according to claim 8, wherein the melt molding is performed at a temperature at least 50° C. higher than the melting point of the polyethylene-based resin.

14. A method for manufacturing the sealing material for use in a solar cell module according to claim 8, wherein a content of the polyethylene-based resin in the resin composition is 99.9 mass % or more.

15. The method for producing a sealing material for use in a solar cell module according to claim 8, wherein a difference in the density of the resin composition between before and after the melt molding is at most 0.05 g/cm$^3$, and
a difference in the MFR of the resin composition between before and after the melt molding is at least 1.0 g/10 min as measured at 190° C. under a load of 2.16 kg according to JIS K 7210.

16. The method for producing a sealing material for use in a solar cell module according to claim 15, wherein a density of the resin composition after the melt molding is at most 0.900 g/cm$^3$.

17. The method for producing a sealing material for use in a solar cell module according to claim 15, wherein the MFR of the resin composition after the melt molding is from 0.1 g/10 min to 1.0 g/10 min as measured at 190° C. under a load of 2.16 kg according to JIS K 7210.

18. A method for manufacturing the sealing material for use in a solar cell module according to claim 15, wherein a ratio of a weight average molecular weight of the polyethylene-based resin after the melt molding to a weight average molecular weight of the polyethylene-based resin before the melt molding is 1.5 to 3.0.

19. A method for manufacturing a solar cell module, comprising the steps of:
providing one or more members,
wherein the one or more members each comprise a transparent front substrate, a front sealing material, a solar cell element, a rear sealing material, and a rear surface-protecting sheet, and
wherein at least one of the front sealing material and the rear sealing material is a sealing material produced according to the method of claim 1; and
layering the one or more members with thermocompression to form the solar cell module.

20. A method for manufacturing a solar cell module, comprising the steps of:
providing one or more members,
wherein the one or more members each comprise a transparent front substrate, a front sealing material, a solar cell element, a rear sealing material, and a rear surface-protecting sheet, and
wherein at least one of the front sealing material and the rear sealing material is a sealing material produced according to the method of claim 8; and
layering the one or more members with thermocompression to form the solar cell module.

21. A method for manufacturing a solar cell module, comprising the steps of:

providing one or more members,
- wherein the one or more members each comprise a transparent front substrate, a front sealing material, a solar cell element, a rear sealing material, and a rear surface-protecting sheet, and
- wherein at least one of the front sealing material and the rear sealing material is a sealing material produced according to the method of claim 15; and layering the one or more members with thermocompression to form the solar cell module.

* * * * *